(12) United States Patent
Ota

(10) Patent No.: US 10,649,005 B2
(45) Date of Patent: May 12, 2020

(54) CONTACT TERMINAL, INSPECTION JIG, AND INSPECTION DEVICE

(71) Applicant: NIDEC READ CORPORATION, Kyoto (JP)

(72) Inventor: Norihiro Ota, Kyoto (JP)

(73) Assignee: NIDEC-READ CORPORATION, Kyoto (JP)

(*) Notice: Subject to any disclaimer, the term of this patent is extended or adjusted under 35 U.S.C. 154(b) by 13 days.

(21) Appl. No.: 16/076,005

(22) PCT Filed: Jan. 16, 2017

(86) PCT No.: PCT/JP2017/001244
§ 371 (c)(1),
(2) Date: Aug. 7, 2018

(87) PCT Pub. No.: WO2017/138305
PCT Pub. Date: Aug. 17, 2017

(65) Prior Publication Data
US 2019/0178910 A1    Jun. 13, 2019

(30) Foreign Application Priority Data
Feb. 8, 2016    (JP) ................... 2016-021869

(51) Int. Cl.
*G01R 1/067* (2006.01)
*G01R 31/28* (2006.01)

(52) U.S. Cl.
CPC ..... *G01R 1/06722* (2013.01); *G01R 31/2808* (2013.01); *G01R 1/06772* (2013.01)

(58) Field of Classification Search
CPC ............ G01R 1/06716; G01R 1/06722; G01R 1/06727
(Continued)

(56) References Cited

U.S. PATENT DOCUMENTS 4,438,397 A * 3/1984 Katz .................. G01R 1/06722
                                                324/72.5
4,508,405 A * 4/1985 Damon ................ H05K 7/1069
                                                324/754.08
(Continued)

FOREIGN PATENT DOCUMENTS

JP    2010281601 A    12/2010
JP    2013053931 A     3/2013
(Continued)

*Primary Examiner* — Patrick Assouad
*Assistant Examiner* — Demetrius R Pretlow
(74) *Attorney, Agent, or Firm* — Viering, Jentschura & Partner MBB

(57) ABSTRACT

A contact terminal may include an outer tubular body being tubular and conductive and an inner tubular body being tubular and conductive, that is inserted into a cylinder of the outer tubular body. An outer first spring part that is elastic in an axial direction of the outer tubular body and whose winding direction is a first direction to be formed into a helical shape, may be formed on the outer tubular body. An inner first spring part that is elastic in an axial direction of the inner tubular body and whose winding direction is a second direction that is opposite to the first direction to be formed into a helical shape, may be formed on the inner tubular body.

20 Claims, 6 Drawing Sheets

(58) Field of Classification Search
USPC .................... 324/754.03, 754.08–754.09, 324/754.12–754.14, 755.01–755.03
See application file for complete search history.

(56) References Cited

U.S. PATENT DOCUMENTS

| | | | | | |
|---|---|---|---|---|---|
| 4,658,212 | A | * | 4/1987 | Ozawa | G01R 31/045 324/72.5 |
| 5,291,129 | A | * | 3/1994 | Kazama | G01R 1/06738 324/750.26 |
| 6,034,532 | A | * | 3/2000 | Tarzwell | G01R 1/06722 324/755.05 |
| 6,275,054 | B1 | * | 8/2001 | Boyle | G01R 1/06722 324/72.5 |
| 6,462,567 | B1 | * | 10/2002 | Vinther | G01R 1/06722 324/754.14 |
| 6,861,862 | B1 | * | 3/2005 | Tate | G01R 1/0466 324/756.02 |
| 8,018,242 | B2 | * | 9/2011 | Nakayama | G01R 31/2889 324/755.01 |
| 8,547,128 | B1 | * | 10/2013 | Sochor | G01R 1/06722 324/750.25 |
| 8,975,906 | B2 | * | 3/2015 | Jeong | G01R 1/06722 324/754.03 |
| 9,109,294 | B2 | * | 8/2015 | Kojima | C25D 1/02 |
| 2002/0093355 | A1 | * | 7/2002 | Parker | G01R 1/07314 324/755.05 |
| 2003/0218472 | A1 | * | 11/2003 | Winter | G01R 1/0441 324/750.25 |
| 2004/0212381 | A1 | * | 10/2004 | Yoshida | G01R 1/06772 324/755.02 |
| 2005/0030050 | A1 | * | 2/2005 | Jung | G01R 1/06722 324/754.14 |
| 2005/0237070 | A1 | * | 10/2005 | Kazama | G01R 1/06722 324/754.03 |
| 2005/0253602 | A1 | * | 11/2005 | Cram | G01R 1/06722 324/754.09 |
| 2006/0220666 | A1 | * | 10/2006 | Kazama | G01R 1/06722 324/754.14 |
| 2007/0128906 | A1 | * | 6/2007 | Kazama | G01R 1/06722 439/179 |
| 2007/0141877 | A1 | * | 6/2007 | Lee | G01R 1/0466 439/137 |
| 2010/0123476 | A1 | * | 5/2010 | Kazama | G01R 1/06722 324/755.01 |
| 2010/0271061 | A1 | * | 10/2010 | Yamamoto | G01R 1/06722 324/754.03 |
| 2011/0025358 | A1 | * | 2/2011 | Kazama | G01R 1/07371 324/755.01 |
| 2011/0050261 | A1 | * | 3/2011 | Li | G01R 1/06766 324/754.03 |
| 2011/0275229 | A1 | * | 11/2011 | Lin | H01R 12/714 439/68 |
| 2012/0001650 | A1 | * | 1/2012 | Stacey | B08B 1/04 324/755.05 |
| 2013/0033278 | A1 | * | 2/2013 | Ohta | G01R 1/06722 324/750.25 |
| 2013/0057308 | A1 | * | 3/2013 | Yano | G01R 3/00 324/755.01 |
| 2013/0069684 | A1 | * | 3/2013 | Jeong | G01R 1/06722 324/755.05 |
| 2015/0168455 | A1 | * | 6/2015 | Anraku | C22C 5/04 324/754.03 |
| 2016/0025776 | A1 | * | 1/2016 | Song | G01R 1/06722 324/754.03 |
| 2016/0116502 | A1 | * | 4/2016 | Nie | G01R 1/06722 324/754.08 |
| 2016/0118738 | A1 | * | 4/2016 | Nasu | G01R 1/06722 439/700 |
| 2017/0082656 | A1 | * | 3/2017 | Chen | G01R 1/06722 |
| 2017/0122978 | A1 | * | 5/2017 | Li | G01R 1/06722 |
| 2017/0192036 | A1 | * | 7/2017 | Tsai | G01R 1/06722 |
| 2017/0219623 | A1 | * | 8/2017 | Choi | G01R 1/07314 |

FOREIGN PATENT DOCUMENTS

JP 2014119435 A 6/2014
WO 2011115082 A1 9/2011

* cited by examiner

CONTACT TERMINAL, INSPECTION JIG, AND INSPECTION DEVICE

CROSS-REFERENCE TO RELATED APPLICATIONS

This application is a national stage entry according to 35 U.S.C. 371 of PCT Application No. PCT/JP2017/001244 filed on Jan. 16, 2017, which claims priority to Japanese Application No. 2016-021869 filed on Feb. 8, 2016, which are entirely incorporated herein by reference.

TECHNICAL FIELD

The present disclosure relates to a contact terminal for coming into contact with an object, an inspection jig for supporting the contact terminal, and an inspection device including the inspection jig.

BACKGROUND

Contact terminals formed into a stick shape may come into contact with a predetermined target point to electrically connect the target point and a predetermined place (see, for example, Patent Literature 1). The contact terminal in Patent Literature 1 includes a small diameter conductive portion and a large diameter cylinder shape portion that is disposed to surround the small diameter conductive portion. A tip portion of the small diameter conductive portion protrudes from a tip portion of the large diameter cylinder shape portion. A part of the small diameter conductive portion is joined to a part of the large diameter cylinder shape portion. A helical spring is formed as part of the cylinder shape portion of the contact terminal.

Patent Literature 1: JP 2013-53931 A

SUMMARY

However, according to the contact terminal described above, when an electric current for inspection flows through the contact terminal to inspect the target point with which the contact terminal is in contact, the electric current flows through the helical spring. Since the helical spring functions like a coil, a magnetic field is generated in accordance with what is called the right-handed screw rule (the right-hand rule). Therefore, the magnetic field generated in this manner may affect an inspection result.

The present disclosure may provide a contact terminal, an inspection jig, and an inspection device that reduces generation of a magnetic field with inspection.

A contact terminal according to a non-limiting aspect of the present disclosure includes an outer tubular body being tubular and conductive and an inner tubular body being tubular and conductive, that is inserted into a cylinder of the outer tubular body. An outer first spring part that is elastic in an axial direction of the outer tubular body and whose winding direction is a first direction to be formed into a helical shape, is formed as part of the outer tubular body. An inner first spring part that is elastic in an axial direction of the inner tubular body and whose winding direction is a second direction that is opposite to the first direction to be formed into a helical shape, is formed as part of the inner tubular body.

According to the above configuration, winding directions of the outer first spring part and the inner first spring part are opposite to each other. Therefore, in a case that an electric current flows through each of the outer tubular body and the inner tubular body, directions of magnetic fields generated on the outer first spring part and the inner first spring part are opposite to each other so as to offset each other. As a result, generation of the magnetic field during inspection is reduced.

In a non-limiting aspect of the disclosure the inner first spring part is positioned at a location opposite the outer first spring part.

According to the above configuration, since the inner first spring part is disposed inside the outer first spring part, the magnetic fields generated on the outer first spring part and the inner first spring part efficiently offset each other.

In a non-limiting aspect of the disclosure an outer second spring part whose winding direction is the second direction is further formed as part of the outer tubular body and an inner second spring part whose winding direction is the first direction is further formed as part of the inner tubular body.

According to the above configuration, the outer first spring part and the outer second spring part whose winding directions are opposite to each other, are formed as part of the outer tubular body. In a case that the outer first spring part and the outer second spring part expand and contract, since directions of rotation forces generated on the outer first spring part and the outer second spring part are opposite to each other, the rotation forces are offset each other. Therefore, a movement of the outer tubular body generated when the contact terminal comes into contact with an object is reduced. The inner first spring part and the inner second spring part whose winding directions are opposite to each other, are formed as part of the inner tubular body. In a case that the inner first spring part and the inner second spring part expand and contract, since directions of rotation forces generated on the inner first spring part and the inner second spring part are opposite to each other, the rotation forces are offset each other. Therefore, a movement of the inner tubular body generated when the contact terminal comes into contact with the object is reduced.

In a non-limiting aspect of the disclosure the inner second spring part is positioned at a location opposite the outer second spring part.

According to the above configuration, since the inner second spring part is disposed inside the outer second spring part, the magnetic fields generated on the outer second spring part and the inner second spring part efficiently offset each other.

In a non-limiting aspect of the disclosure a number of turns of the outer first spring part and a number of turns of the inner first spring part are substantially equal.

When the number of turns of the outer first spring part and the number of turns of the inner first spring part are substantially equal, magnetic field intensities generated on the outer first spring part and the inner first spring part are substantially equal. Consequently, accuracy of an offset of the magnetic fields generated on the outer first spring part and the inner first spring part improves.

A plurality of the outer first spring parts may be formed at a plurality of places of the outer tubular body and a plurality of the inner first spring parts may be formed at a same number of places of the inner tubular body as the outer first spring parts. A total number of turns of spirals of the outer first spring parts formed at the plurality of places and a total number of turns of spirals of the inner first spring parts formed at the plurality of places may be substantially equal.

According to the above configuration, the plurality of outer first spring parts and the plurality of inner first spring parts are provided to offset the magnetic fields generated on the outer first spring parts and the inner first spring parts as the whole of the contact terminal.

In a non-limiting aspect of the disclosure the plurality of outer first spring parts and the plurality of inner first spring parts are positioned at locations to be respectively opposite each other. The number of turns of spirals of one of the plurality of outer first spring parts and the number of turns of spirals of one of the plurality of inner first spring parts that are opposite each other are substantially equal.

According to the above configuration, since the inner first spring parts are respectively positioned inside the plurality of outer first spring parts, the magnetic fields generated on the outer first spring parts and the inner first spring parts efficiently offset each other.

In a non-limiting aspect of the disclosure a number of turns of the outer second spring part and a number of turns of the inner second spring part are substantially equal.

When the number of turns of the outer second spring part and the number of turns of the inner second spring part are substantially equal, magnetic field intensities generated on the outer second spring part and the inner second spring part are substantially equal. Consequently, accuracy of an offset of the magnetic fields generated on the outer second spring part and the inner second spring part improves.

In a non-limiting aspect of the disclosure a plurality of the outer second spring parts are formed at a plurality of places of the outer tubular body and a plurality of the inner second spring parts are formed at a same number of places of the inner tubular body as the outer second spring parts. In a non-limiting aspect of the disclosure a total number of turns of spirals of the outer second spring parts formed at the plurality of places and a total number of turns of spirals of the inner second spring parts formed at the plurality of places are substantially equal.

According to the above configuration, the plurality of outer second spring parts and the plurality of inner second spring parts are provided to offset the magnetic fields generated on the outer second spring parts and the inner second spring parts as the whole of the contact terminal.

The plurality of outer second spring parts and the plurality of inner second spring parts are positioned at locations to be respectively opposed to each other, and a number of turns of spirals of one of the plurality of outer second spring parts and a number of turns of spirals of one of the plurality of inner second spring parts that are opposed to each other are substantially equal.

According to the above configuration, since the inner second spring parts are respectively disposed inside the plurality of outer second spring parts, the magnetic fields generated on the outer second spring parts and the inner second spring parts efficiently offset each other.

In a non-limiting aspect of the disclosure a central conductor being conductive and formed into a stick shape, that is inserted into a cylinder of the inner tubular body, is further provided.

According to the above configuration, the stick shape central conductor comes into contact with an object to be brought into contact with, so that a contact state stabilizes.

In a non-limiting aspect of the disclosure a vertical line with respect to an end surface of one end side of at least one of the outer tubular body and the inner tubular body is slanted relative to an axial line of the at least one of the outer tubular body and the inner tubular body.

According to the above configuration, the at least one of the tubular bodies easily bends according to a slant of the end surface of one end side of at least one of the outer tubular body and the inner tubular body. When the tubular body bends, the tubular body and the central conductor easily come into contact with each other. Therefore, certainty that the tubular body and the central conductor are conducted improves.

An inspection jig according to an aspect of the present disclosure includes a plurality of the contact terminals described above and a support member that supports the plurality of contact terminals.

According to the above configuration, when inspection using the inspection jig that supports the plurality of contact terminals is performed, generation of the magnetic field with inspection is reduced.

An inspection device according to an aspect of the present disclosure includes the inspection jig described above, and an inspection processing portion that brings each of the contact terminals into contact with an inspection point provided on an inspection object and that inspects the inspection object according to an electric signal obtained from each of the contact terminals.

According to the inspection device, generation of the magnetic field with inspection is reduced.

According to the above configuration, the contact terminal, the inspection jig, and the inspection device reduce generation of the magnetic field with inspection.

DETAILED DESCRIPTION

Figure 1:
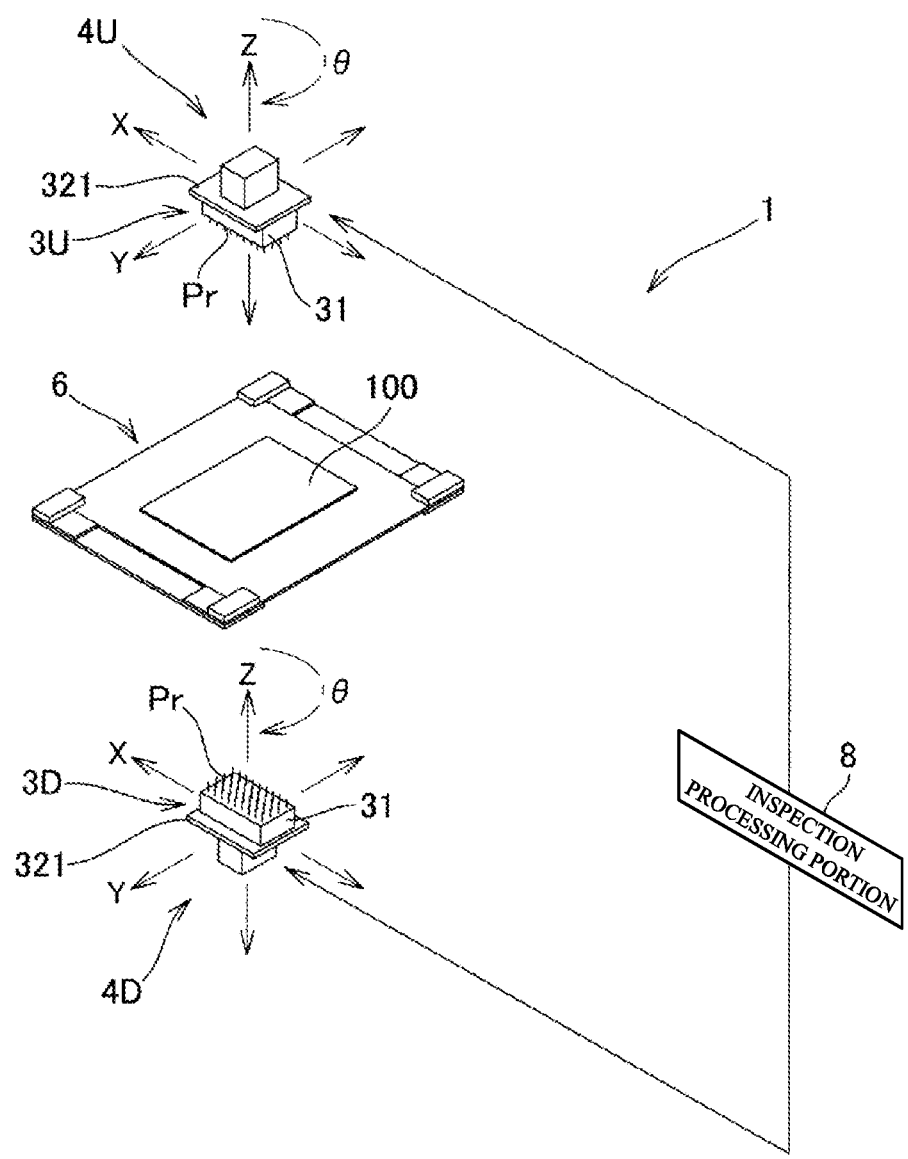
FIG. 1 is a conceptual diagram schematically illustrating a configuration of a board inspection device including contact terminals and inspection jigs.

Hereinafter, embodiments of the present disclosure will be described with reference to the accompanying drawings. In the accompanying drawings, like parts are designated by like reference characters, and redundant description will be omitted. FIG. 1 is a conceptual diagram schematically illustrating a configuration of a board inspection device 1 including contact terminals and inspection jigs. The board inspection device 1 corresponds to an example of an inspection device. The board inspection device 1 illustrated in FIG. 1 is a device used to inspect a circuit pattern formed on a board 100, that is an example of an inspection object.

Various types of boards can be used as the board 100, including, for example, a printed circuit board, a flexible board, a ceramic multilayer circuit board, an electrode plate for use in a liquid crystal display or a plasma display, a semiconductor substrate, a package board for use in a semiconductor package, and a film carrier. The inspection object may not necessarily be a board, but may alternatively be, for example, an electronic component such as a semiconductor device (e.g., an integrated circuit (IC)) or the like, or any other object on which an electrical inspection may be performed.

The board inspection device 1 illustrated in FIG. 1 includes inspection portions 4U and 4D, a board fixing device 6, and an inspection processing portion 8. The board fixing device 6 is configured to fix the board 100 to be inspected to a predetermined position. The inspection portions 4U and 4D respectively include inspection jigs 3U and 3D and plates 321 to which the inspection jigs 3U and 3D are fixed. The inspection portions 4U and 4D are capable of moving the inspection jigs 3U and 3D respectively in x-axis, y-axis, and z-axis directions perpendicular to each other, and are capable of rotating the inspection jigs 3U and 3D about a z-axis, using a driving mechanism (not shown).

The inspection portion 4U is positioned above the board 100, that is fixed to the board fixing device 6. The inspection portion 4D is positioned below the board 100, that is fixed to the board fixing device 6. The inspection jigs 3U and 3D, each of which is configured to inspect a circuit pattern formed on the board 100, are detachably disposed in the inspection portions 4U and 4D, respectively. Hereinafter, the inspection portions 4U and 4D will be collectively referred to as an inspection portion 4 as appropriate.

Each of the inspection jigs 3U and 3D includes a plurality of probes Pr (i.e., contact terminals) and a support block 31 configured to hold the probes Pr so that tips of the probes Pr face to the board 100. Each probe Pr corresponds to an example of a contact terminal. Each of the plates 321 is provided with electrodes, each of which is to be brought into contact with, and electrical connection with, a rear end of a separate one of the probes Pr. Each of the inspection portions 4U and 4D includes a connection circuit (not shown) configured to bring the rear end of each probe Pr into electrical connection with the inspection processing portion 8 through the corresponding electrode provided in the plate 321, or make a switch in the connection.

Each probe Pr is configured to have a stick-like shape. A specific configuration of the probe Pr will be described in detail below. The support block 31 includes a plurality of through holes each of which is configured to support a separate one of the probes Pr. Each through hole is arranged at a position corresponding to the position of an inspection point set on a wiring pattern on the board 100 to be inspected. Therefore, a tip portion of each probe Pr can be brought into contact with the inspection point in the board 100. For example, the plurality of probes Pr are disposed at positions corresponding to points of intersection on a grid. The grid is configured such that horizontal and vertical lines of the grid extend in the x-axis and y-axis directions perpendicular to each other. The inspection point is, for example, a wiring pattern, a solder bump, a connection terminal, or the like.

The inspection jigs 3U and 3D are similar in configuration each other except in the arrangement of the probes Pr and in that the inspection jigs 3U and 3D are attached in opposite directions, i.e., upwardly and downwardly, to the inspection portions 4U and 4D, respectively. Hereinafter, the inspection jigs 3U and 3D will be collectively referred to as an inspection jig 3 as appropriate. The inspection jig 3 can be replaced with another inspection jig in accordance with the board 100 to be inspected.

The inspection processing portion 8 includes, for example, a power supply circuit, a voltmeter, an ammeter, a microcomputer, and so on. The inspection processing portion 8 is configured to control the driving mechanism (not shown) to move and position each of the inspection portions 4U and 4D to bring each tip of the probe Pr into contact with the corresponding inspection point in the board 100. Each inspection point is thus electrically connected to the inspection processing portion 8. The inspection processing portion 8 is configured to supply a test electric current or voltage to each inspection point in the board 100 through each of the probes Pr of the inspection jig 3 in the above-described situation, and inspect the board 100 for, for example, a disconnection in a circuit pattern, a short circuit, or the like on the basis of a voltage signal or a current signal obtained from each probe Pr. Alternatively, the inspection processing portion 8 may be configured to supply an alternating current or voltage to each inspection point, and thus measure an impedance to be inspected on the basis of a voltage signal or a current signal obtained from each probe Pr.

Figure 2:
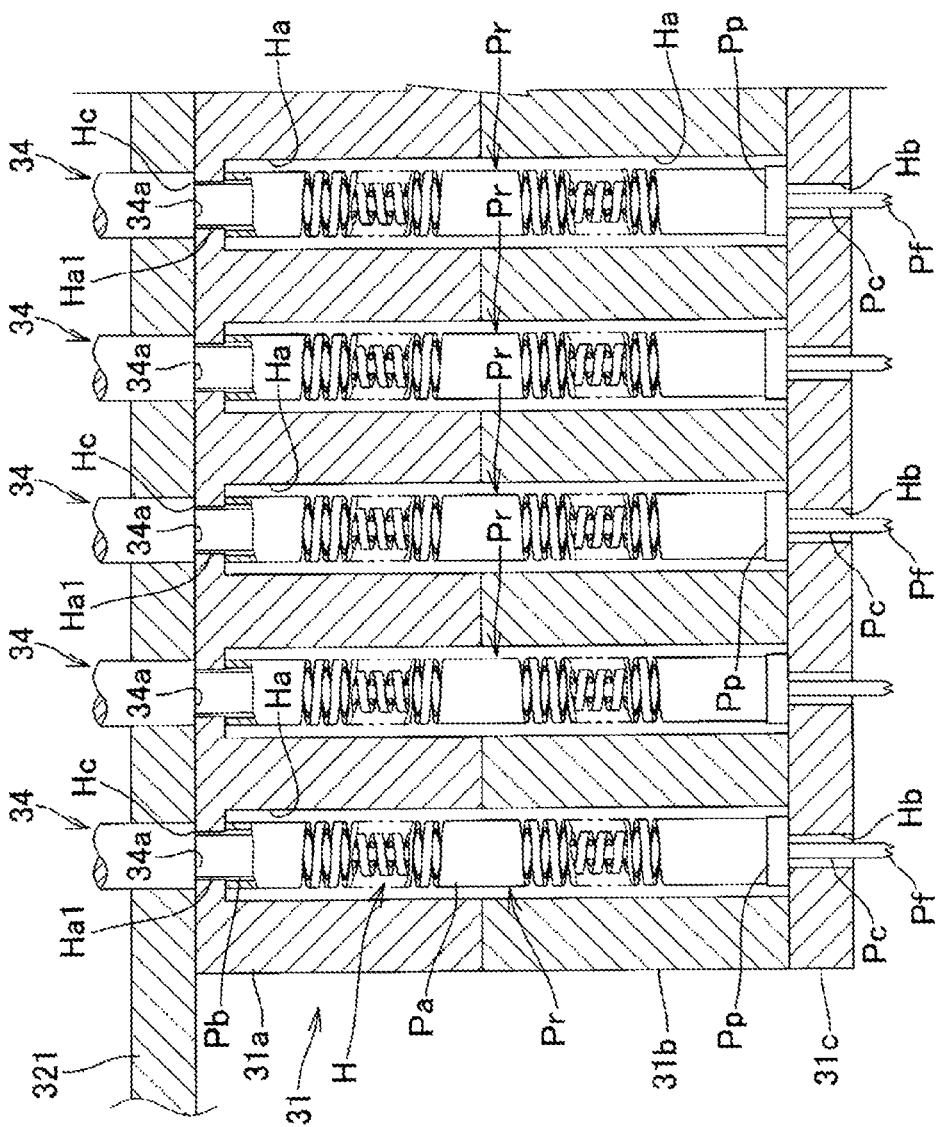
FIG. 2 is a schematic view illustrating an example of a configuration of a support block and a plate shown in FIG. 1.

FIG. 2 is a schematic view illustrating an example of a configuration of the support block 31 and the plate 321 shown in FIG. 1. The support block 31 illustrated in FIG. 2 is defined by, for example, plate-shaped support plates 31a, 31b, and 31c placed one upon another. The support plate 31c is disposed at a tip side of the support block 31, while the support plate 31a is disposed at a rear end side of the support block 31. In addition, the support block 31 includes a plurality of through holes H each of which is configured to pass through the support plates 31a, 31b, and 31c.

Through holes of the support plates 31a and 31b are referred to as hole portions Ha. Through holes of the support plate 31c are referred to as narrow portions Hb. The support plate 31a includes decreased diameter portions Ha1 each of which has a hole diameter smaller than that of each hole portion Ha, that is disposed on a side where the hole portion Ha is opened on a surface that is opposed to the plate 321, i.e., a rear end side of the hole portion Ha. Then, the hole portion Ha and the narrow portion Hb are connected to each other to define through hole H.

The support block 31, as an example of a support member, may not be necessarily defined by the plate-shaped support plates 31a, 31b, and 31c placed one upon another. The support member may alternatively be defined by, for example, a single monolithic member including the hole portions Ha and the narrow portions Hb to form the through holes H. The narrow portions Hb may not necessarily be formed in the support member but the whole through hole H may alternatively be defined by the hole portion Ha. The decreased diameter portions Ha1 may not be necessarily formed as part of the hole portions Ha. According to the configuration described above, the support plates 31a and 31b of the support member are placed one upon another. The support member may be defined by a configuration where the support plates 31a and 31b are retained by, for example, a post to be apart from each other.

The plate 321, that is made of, for example, an insulating resin material, is attached to a rear end side of the support plate 31a. A rear end side opening portion Hc of each through hole H is closed with the plate 321. Wires 34 are attached to positions of the plate 321 each of which is opposed to the rear end side opening portion Hc such that each wire 34 passes through the plate 321. A surface of the plate 321 that faces the support plate 31a and an end surface of each wire 34 that is exposed to the surface of the plate 321 are configured to be flush with each other. The end surface of each wire 34 forms an electrode 34a.

The probe Pr is inserted into each of the through holes H. Each of the probes Pr includes an outer tubular body Pa that is tubular and conductive, an inner tubular body Pb being tubular and conductive, that is inserted into a cylinder of the outer tubular body Pa, and a central conductor Pc being conductive and formed into a stick shape, that is inserted into a cylinder of the inner tubular body Pb.

Figure 3:
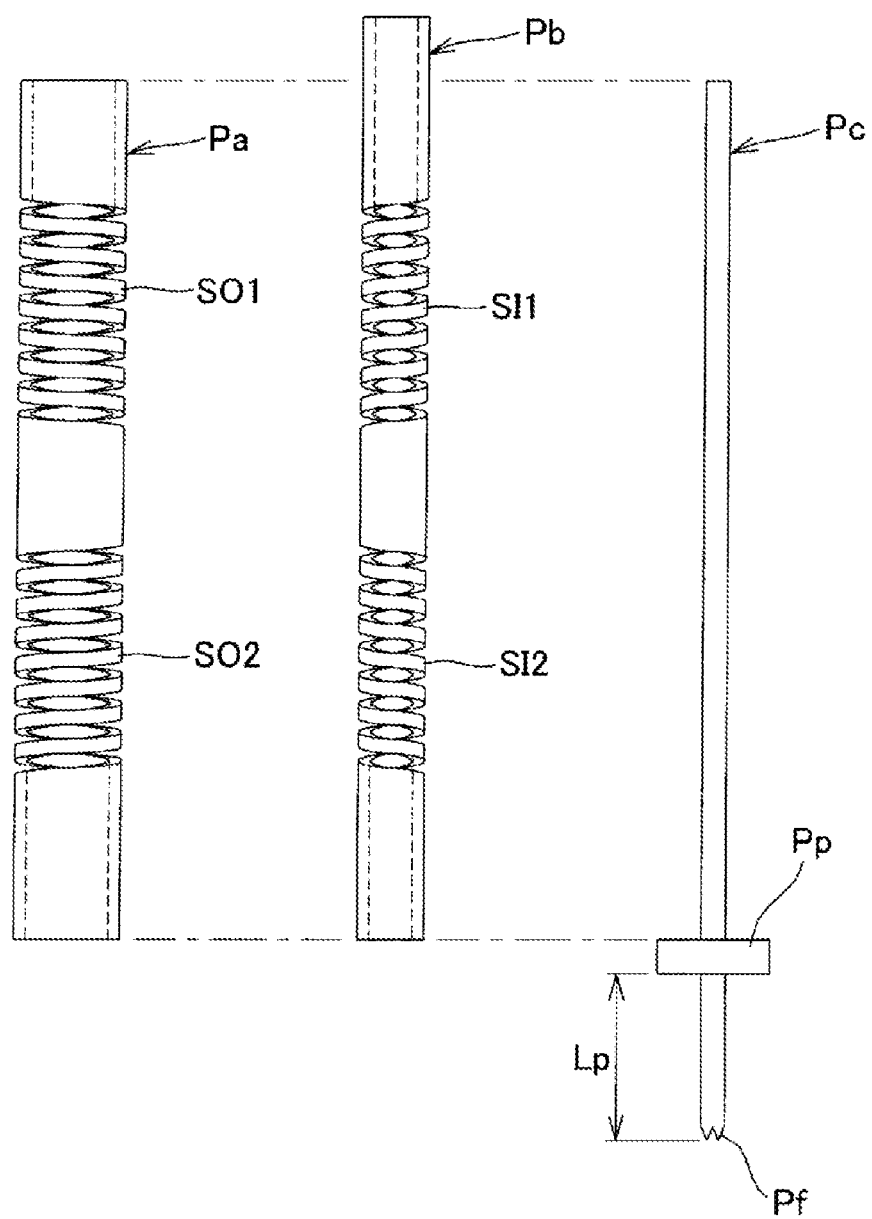
FIG. 3 is a plan view illustrating a probe disassembled into an outer tubular body, an inner tubular body, and a central conductor.

FIG. 3 is a plan view illustrating the probe Pr disassembled into the outer tubular body Pa, the inner tubular body Pb, and the central conductor Pc. An outer first spring part SO1 that is elastic in an axial direction of the outer tubular body Pa and whose winding direction is a first direction to be formed into a helical shape, is formed as part of the outer tubular body Pa. An outer second spring part SO2 that is elastic in the axial direction of the outer tubular body Pa and whose winding direction is a second direction that is opposite to the first direction to be formed into a helical shape, is formed as part of the outer tubular body Pa. The numbers of turns of spirals and line widths of the outer first spring part SO1 and the outer second spring part SO2 are substantially equal respectively.

An outer diameter of the outer tubular body Pa is larger than an inner diameter of each of the decreased diameter portions Ha1. Therefore, the probe Pr that is inserted into the through hole H does not fall out of the decreased diameter portion Ha1. Lengths of the outer tubular body Pa and the inner tubular body Pb may be equal not to provide the decreased diameter portions Ha1.

An inner first spring part SI1 that is elastic in an axial direction of the inner tubular body Pb and whose winding direction is the second direction to be formed into a helical shape, is formed as part of the inner tubular body Pb. An inner second spring part SI2 that is elastic in the axial direction of the inner tubular body Pb and whose winding direction is the first direction to be formed into a helical shape, is formed as part of the inner tubular body Pb. The numbers of turns of spirals and line widths of the inner first spring part SI1 and the inner second spring part SI2 are substantially equal respectively.

An outer diameter of the inner tubular body Pb is formed to be smaller than an inner diameter of the outer tubular body Pa so that the inner tubular body Pb is inserted into the cylinder of the outer tubular body Pa. The inner tubular body Pb is formed to be larger than the outer tubular body Pa. Nickel or nickel alloy, for example, may be used as material for the outer tubular body Pa and the inner tubular body Pb.

A manufacturing method of the spring part like the inner first spring part SI1, the inner second spring part SI2, the outer first spring part SO1, and the outer second spring part SO2, and the like, is not intended to be restricted. A helical slit may be formed in a circumferential wall of a tubular member by etching to form the spring part. A shape having the helical slit on the circumferential wall of the tubular member may be formed by electroforming to form the spring part. Various manufacturing methods are used for forming the spring part.

Each of the central conductors Pc is formed into a substantially columnar shape and inserted into the cylinder of the inner tubular body Pb. A protrusion portion Pp projecting around like a flange is provided in the vicinity of a tip portion Pf of each of the central conductors Pc. A diameter of the central conductor Pc is smaller than an inner diameter of the narrow portion Hb. A diameter of the protrusion portion Pp is larger than the inner diameter of the narrow portion Hb and not less than the outer diameter of the outer tubular body Pa. Palladium alloy, for example, that is difficult to be soldered, may be suitably used as material of the central conductor Pc.

A difference between the inner diameter of the outer tubular body Pa and the outer diameter of the inner tubular body Pb, and a difference between an inner diameter of the inner tubular body Pb and an outer diameter of the central conductor Pc are set to be minute respectively. Hence, the outer tubular body Pa, the inner tubular body Pb, and the central conductor Pc are slidably in contact with each other to be electrically conducted.

A length Lp from a tip facing surface of the protrusion portion Pp to the tip portion Pf is set to be slightly larger than a thickness of the support plate 31c. Therefore, the outer tubular body Pa and the inner tubular body Pb into which the central conductor Pc is inserted, are engaged with each other by the protrusion portion Pp, so that the tip portion Pf of the central conductor Pc that is inserted into the narrow portion Hb slightly projects out from the support plate 31c and the probe Pr that is inserted into the through hole H is prevented from falling out of the narrow portion Hb. As described above, the tip portion Pf is brought into contact with the inspection point on the board 100 by slight protrusion of the tip portion Pf from the support plate 31c.

The tip portion Pf may be formed into various shapes, such as, a crown shape as illustrated in FIG. 3, a flat shape, a hemisphere shape, a cone shape, or a truncated cone shape.

In a non-limiting aspect of the disclosure the outer tubular body Pa and the inner tubular body Pb are joined together by, for example, electric welding near the tips, i.e., near the protrusion portion Pp. The whole or a part of the outer tubular body Pa, the inner tubular body Pb, and the central conductor Pc may be gold plated, for example. According to the configuration described above, certainty of conduction between the outer tubular body Pa, the inner tubular body Pb, and the central conductor Pc improves.

A length of the probe Pr under not compressed condition, i.e., a length from the tip portion Pf to a rear end portion of the inner tubular body Pb, may be set to, for example, 10 mm to 30 mm, or about 20 mm. A thickness of the probe Pr, i.e., the outer diameter of the outer tubular body Pa, may be set to, for example, about 25 to 300 μm, or about 100 μm. The outer tubular body Pa is set to be shorter than the inner tubular body Pb, considering that the outer tubular body Pa is engaged by the decreased diameter portion Ha1. A length of the central conductor Pc is set such that when the tip portion Pf is pressed to the inspection point, a rear end portion of the central conductor Pc is not brought into contact with the electrode 34a before the tip portion Pf enters the narrow portion Hb against bias forces by spring pressures of the outer tubular body Pa and the inner tubular body Pb.

A total thickness of the support plates 31a and 31b, i.e., a distance between a tip side surface of the plate 321 and a rear end side surface of the support plate 31c, is slightly shorter than a length that is defined by adding a natural length of the inner tubular body Pb under not compressed condition to a thickness of the protrusion portion Pp. Hence, the inner tubular body Pb that is inserted into the through hole H and sandwiched between the plate 321 and the protrusion portion Pp is slightly compressed. Consequently, the rear end portion of the inner tubular body Pb is brought into contact with the electrode 34a by the bias forces of the inner first spring part SI1 and the inner second spring part SI2.

Therefore, the inner tubular body Pb and the electrode 34a conduct so that the inner tubular body Pb is electrically connected to the inspection processing portion 8 through the wire 34. Since the outer tubular body Pa, the inner tubular body Pb, and the central conductor Pc are conducted with each other, the inspection point can be electrically connected to the inspection processing portion 8 by bringing the tip portion of the probe Pr, i.e., the tip portion Pf of the central conductor Pc, into contact with the inspection point of the board 100 to be inspected.

A length that is defined by subtracting a length of the decreased diameter portion Ha1 from a total thickness of the support plates 31a and 31b is set to be slightly shorter than a length that is defined by adding the natural length of the outer tubular body Pa under not compressed condition to the thickness of the protrusion portion Pp. Hence, the tip portion Pf of the probe Pr projects out from the support plate 31c by the bias forces of the outer first spring part SO1, the outer second spring part SO2, the inner first spring part SI1, and the inner second spring part SI2. As a result, the tip portion Pf of the probe Pr is elastically brought into contact with the inspection point of the board 100 to be inspected. Since a spring provided on the outer tubular body Pa and a spring provided on the inner tubular body Pb doubly apply bias forces to the tip portion Pf, a contact pressure to the inspection point is multiplied, so that contact condition of the probe Pr and the inspection point becomes stable and contact resistance of the probe Pr and the inspection point reduces.

The outer first spring part SO1 and the outer second spring part SO2 rotate around an axial line thereof with expansion and contraction, when expanding and contracting. When the probe Pr is pressed to or separated from the inspection point, the outer first spring part SO1 and the outer second spring part SO2 contract or expand. Hence, a force to rotate the outer tubular body Pa that is connected to the outer first spring part SO1 and the outer second spring part SO2 around the axial line is generated.

Between the outer first spring part SO1 and the outer second spring part SO2, winding directions of spirals are opposite to each other, the line widths of the spring parts (the helical portions) are substantially equal, and the numbers of the turns are substantially equal. Therefore, with respect to rotation forces generated on the outer first spring part SO1 and generated on the outer second spring part SO2, rotation directions of the rotation forces are opposite to each other and magnitudes of the rotation forces are substantially equal. As a result, the rotation forces generated on the outer first spring part SO1 and generated on the outer second spring part SO2 are offset, so that the outer tubular body Pa is restrained from rotating.

Similarly, between the inner first spring part SI1 and the inner second spring part SI2, winding directions of spirals are opposite to each other, the line widths of the spring parts (the helical portions) are substantially equal, and the numbers of the turns are substantially equal. As a result, a rotation force that rotates the inner tubular body Pb with expansion and contraction, is offset on the inner first spring part SI1 and the inner second spring part SI2, so that the inner tubular body Pb is restrained from rotating.

As described above, since the outer tubular body Pa and the inner tubular body Pb are restrained from rotating, a movement of the probe Pr reduces, when the probe Pr comes into contact with the inspection point. Therefore, since the inspection point and the probe Pr are stably brought into contact with each other, variation of contact resistance of the inspection point and the probe Pr reduces. As a result, inspection stability and inspection accuracy improve.

In a state that the outer tubular body Pa and the inner tubular body Pb are assembled as the probe Pr, the outer first spring part SO1 and the inner first spring part SI1 are positioned at locations opposite each other, and the numbers of turns of spirals of the outer first spring part SO1 and the inner first spring part SI1 are substantially equal. Similarly, the outer second spring part SO2 and the inner second spring part SI2 are positioned at locations opposite each other, and the numbers of turns of spirals of the outer second spring part SO2 and the inner second spring part SI2 are substantially equal.

Since the winding direction of the spiral of the outer first spring part SO1 is the first direction and the winding direction of the spiral of the inner first spring part SI1 is the second direction, the winding directions of the spirals of the outer first spring part SO1 and the inner first spring part SI1 that are opposed to each other are opposite to each other. The numbers of turns of spirals of the spring parts that are arranged opposite each other are substantially equal.

Hence, when an electric current flows through the probe Pr, directions of magnetic fields generated on the outer first spring part SO1 and the inner first spring part SI1 are opposite to each other and magnetic field intensities are substantially equal. Consequently, the magnetic fields generated on the outer first spring part SO1 and the inner first spring part SI1 are offset.

Since the winding direction of the spiral of the outer second spring part SO2 is the second direction and the winding direction of the spiral of the inner second spring part SI2 is the first direction, the winding directions of the spirals of the outer second spring part SO2 and the inner second spring part SI2 that are opposed to each other are opposite to each other. The numbers of turns of spirals of the spring parts that are arranged opposite each other are substantially equal.

Hence, when the electric current flows through the probe Pr, directions of magnetic fields generated on the outer second spring part SO2 and the inner second spring part SI2 are opposite to each other and magnetic field intensities are substantially equal. Consequently, the magnetic fields generated on the outer second spring part SO2 and the inner second spring part SI2 are offset.

According to the probe Pr described above, since the magnetic fields generated on the spring parts of the probe Pr are offset to reduce, generation of the magnetic field with inspection is reduced. When the magnetic field is generated on the probe with inspection, the magnetic field affects the board 100 to be inspected, so that inspection accuracy may reduce. Further, between the probes that are adjacent to each other, the magnetic fields affect each other, so that inspection accuracy may reduce. According to the probe Pr described above, since generation of the magnetic field with inspection reduces, a reduce of inspection accuracy by influence of the magnetic field is restrained.

In a case that impedance measurement is performed with respect to the board 100, an alternating current sometimes flows from the inspection processing portion 8 to the probes Pr. In this case, the helical springs act as a coil. According to the probe Pr described above, the magnetic fields generated on the outer first spring part SO1 and the inner first spring part SI1 are offset, and the magnetic fields generated on the outer second spring part SO2 and the inner second spring part SI2 are offset. Hence, an inductance component included in the whole probe Pr reduces. As a result, impedance measurement accuracy with the probe Pr is restrained from being reduced by the spring part.

Figures 4A, 4B:
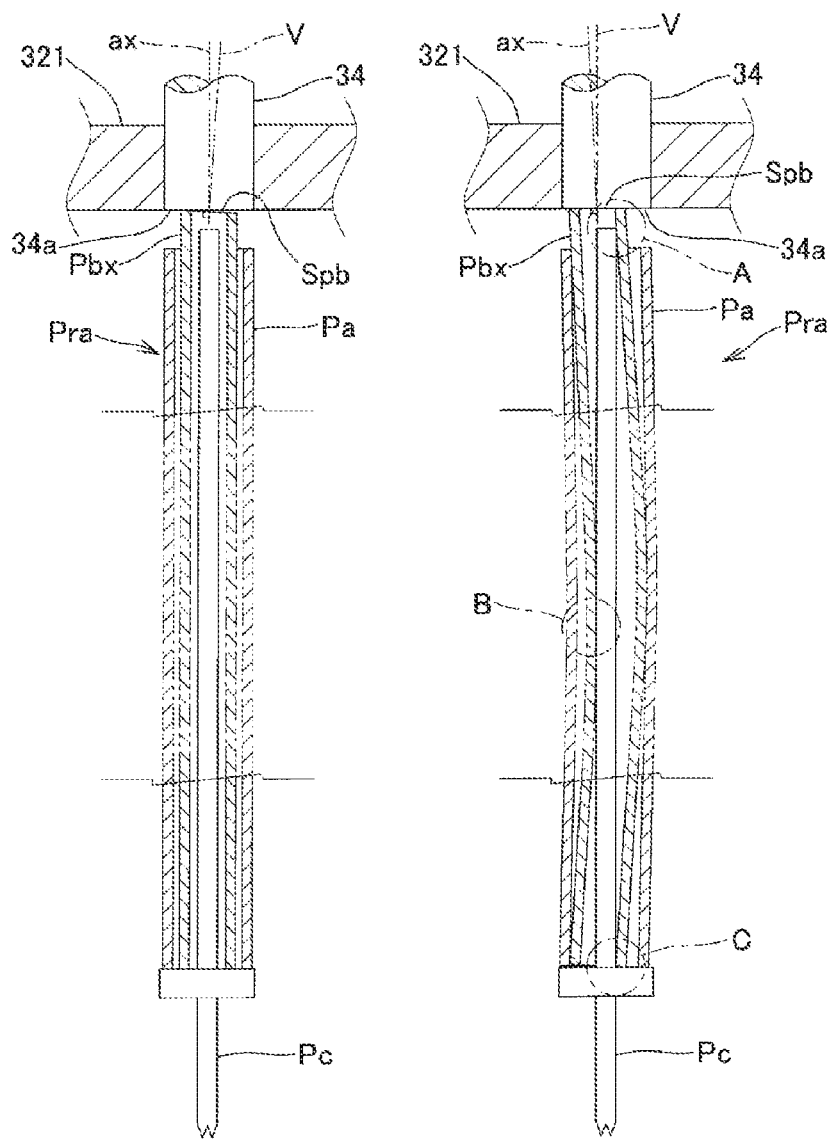
FIGS. 4A and 4B are schematic sectional views illustrating another example of the probe shown in FIGS. 2 and 3.
Figure 5:
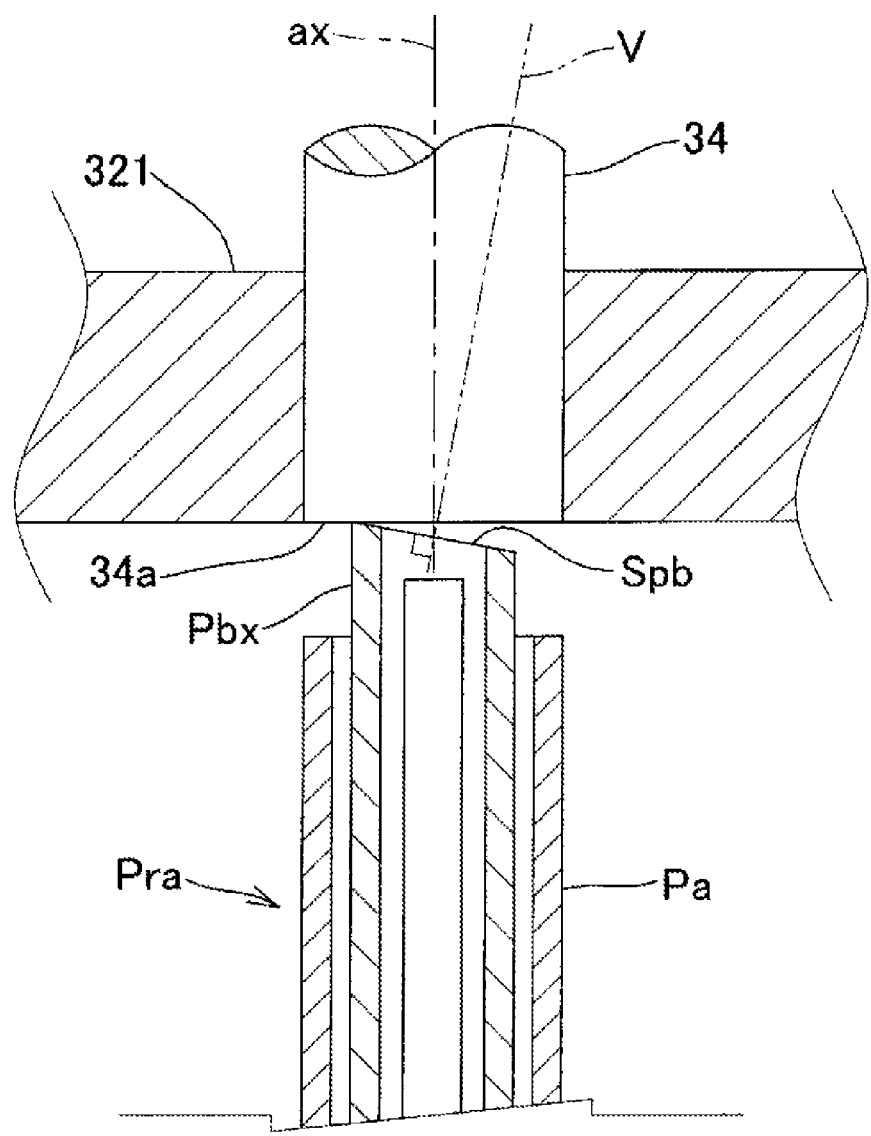
FIG. 5 is an enlarged view of vicinity of a rear end of the probe shown in FIG. 4A.

FIGS. 4A and 4B are schematic sectional views illustrating another example of the probe shown in FIGS. 2 and 3. FIG. 5 is an enlarged view of a vicinity of a rear end of a probe Pra shown in FIG. 4A. The probe Pra illustrated in FIGS. 4A, 4B, and 5 has a shape of an inner tubular body Pbx different from that of the probe Pr illustrated in FIGS. 2 and 3. According to the inner tubular body Pbx, a vertical line V with respect to a rear end surface SPb, that is an end surface of a rear end portion of the inner tubular body Pbx, is slanted relative to an axial line ax of the inner tubular body Pbx. In other respects, the probe Pra is formed like the probe Pr.

A state of non-compressed probe Pra is illustrated in FIG. 4A, and a state of slightly compressed probe Pra that is accommodated in the support block 31 is illustrated in FIG. 4B. When a compression pressure is applied to the probe Pra in an axial direction, as illustrated in FIG. 4B, the rear end surface SPb is pressed to the electrode 34a. Therefore, the inner tubular body Pbx bends so that the rear end surface SPb, whose vertical line V is slanted relative to the axial line ax, comes into contact with along the electrode 34a. Since the central conductor Pc attempts to maintain a straight shape, the inner tubular body Pbx and the central conductor Pc easily make contact with each other at contact places A, B, and C by bending of the inner tubular body Pbx, as illustrated in FIG. 4B.

Hence, certainty of conduction between the inner tubular body Pbx directly being in contact with the electrode 34a and the central conductor Pc improves. Especially, an electric current flowing from the electrode 34a to the tip portion Pf that comes in contact with the inspection point, flows into the central conductor Pc from the contact place A by conduction between the inner tubular body Pbx and the central conductor Pc at the contact place A that is a location near the electrode 34a, so that an electric current flowing into the outer tubular body Pa and the inner tubular body Pbx reduces. By a reduction of the electric current flowing into the outer tubular body Pa and the inner tubular body Pbx, the magnetic fields generated on the inner first spring part SI1, the inner second spring part SI2, the outer first spring part SO1, and the outer second spring part SO2 reduce. According to the probe Pra, generation of the magnetic field with inspection is reduced more than the probe Pr.

Lengths of the outer tubular body Pa and the inner tubular body Pb may be equal not to provide the decreased diameter portions Ha1 on the support plate 31a. The rear end surfaces of both the outer tubular body Pa and the inner tubular body Pb may be configured so that each of vertical lines with respect to the rear end surfaces of the tubular bodies is slanted relative to each of the axial lines of the tubular bodies. Alternatively, the rear end surface of only the outer tubular body Pa may be configured so that the vertical line with respect to the rear end surface of the outer tubular body Pa is slanted relative to the axial line of the outer tubular body Pa.

With respect to each of the inner first spring part SI1, the inner second spring part SI2, the outer first spring part SO1, and the outer second spring part SO2, a plurality of the spring parts may be scatteredly formed at a plurality of places of each of the outer tubular body Pa and the inner tubular body Pb (Pbx). In a non-limiting aspect of the disclosure a plurality of the outer first spring parts SO1 are disposed to be respectively opposed to a plurality of the inner first spring parts SI1 and a plurality of the outer second spring parts SO2 are disposed to be respectively opposed to a plurality of the inner second spring parts SI2. With respect to the spring parts that are arranged opposite each other, in a non-limiting aspect of the disclosure the numbers of turns of spirals are substantially equal.

The inner first spring part SI1 and the outer first spring part SO1 need not be necessarily opposite each other, and the inner second spring part SI2 and the outer second spring part SO2 need not be necessarily opposite each other. In a non-limiting aspect of the disclosure the spring parts are arranged opposite each other in terms of offsetting the magnetic fields, however, offset effect of the magnetic field is obtained as the whole of the probe without an opposed arrangement.

The present disclosure is not to be intended to restrict to the example where the numbers of turns of spirals between the opposed spring parts are substantially equal. The total number of turns of spirals of the plurality of inner first spring parts SI1 and the total number of turns of spirals of the plurality of outer first spring parts SO1 may be substantially equal. The total number of turns of spirals of the plurality of inner second spring parts SI2 and the total number of turns of spirals of the plurality of outer second spring parts SO2 may be substantially equal. Also, in this case, offset effect of the magnetic field is obtained as the whole of the probe.

The probe may not include the inner second spring part SI2 and the outer second spring part SO2. Offset effect of the magnetic field is obtained from the inner first spring part SI1 and the outer first spring part SO1 without the inner second spring part SI2 and the outer second spring part SO2. The end portion of at least one of the outer tubular body Pa and the inner tubular body Pb (Pbx) may come into contact with the inspection point of the board 100 without the central conductor Pc.

Figure 6:
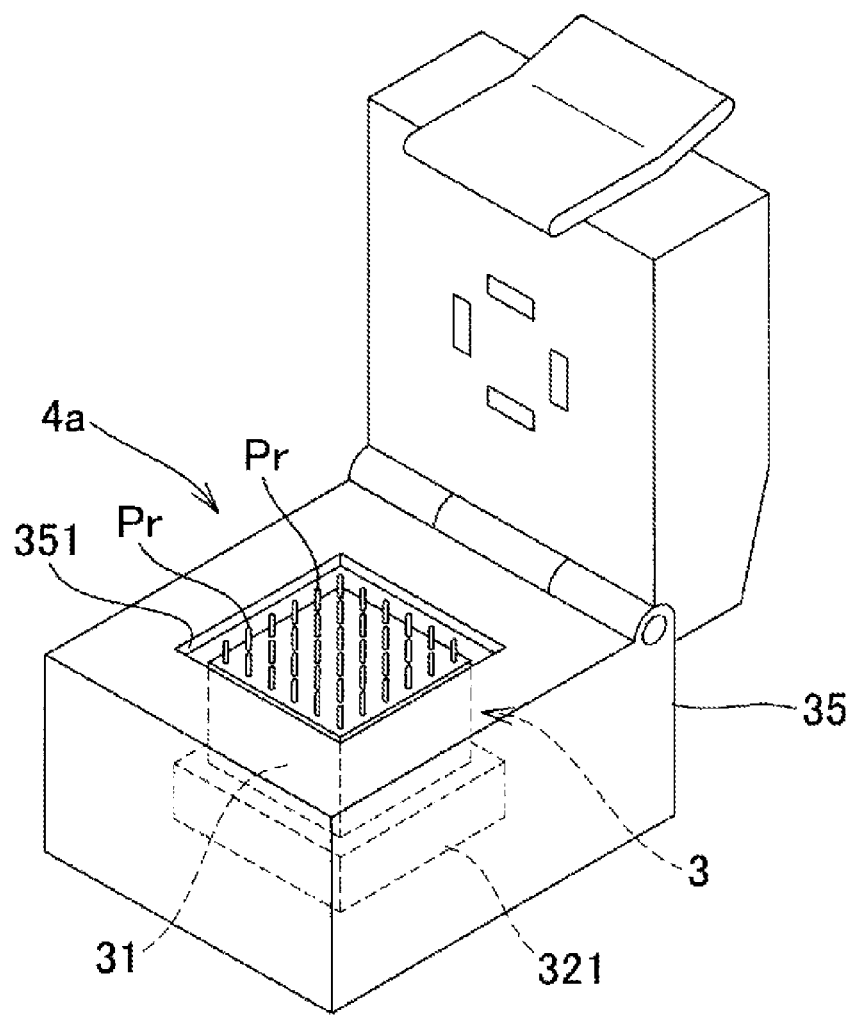
FIG. 6 is a perspective view illustrating another example of an inspection portion shown in FIG. 1.

The inspection object may be, for example, a semiconductor element (IC), and the inspection device may be an IC inspection device. FIG. 6 is a perspective view illustrating another example of an inspection portion 4 shown in FIG. 1. As shown in FIG. 6, an inspection portion 4a is configured to incorporate the inspection jig 3 into so-called an IC socket 35. The inspection portion 4a, without the driving mechanism included in the inspection portion 4, is configured that the probe Pr comes into contact with an IC pin, a bump, or an electrode that are installed on the IC socket 35. Needless to say, the inspection portion 4a may include the probe Pra instead of the probe Pr. The inspection device is configured as the IC inspection device with the inspection portion 4a instead of the inspection portions 4U and 4D shown in FIG. 1.

When inspection is performed with the IC socket as illustrated in FIG. 6, the electrode 34a of the plate 321 and an inspection point of IC sometimes conduct with an anisotropic conductive rubber instead of the inspection jig 3 illustrated in FIG. 6. However, since resolution of the anisotropic conductive rubber is low, a short distance between the inspection points because of fine pitch IC to be inspected reduces inspection accuracy. When the fine pitch IC being inspected, by replacing the anisotropic conductive rubber with the inspection jig 3, inspection accuracy improves as compared to a case using the anisotropic conductive rubber.

REFERENCE SIGNS LIST 1 board inspection device (inspection device)
3, 3U, 3D inspection jig
4, 4U, 4D inspection portion
6 board fixing device
8 inspection processing portion
31 support block (support member)
31a, 31b, 31c support plate
34 wire
34a electrode
100 board (inspection object)
321 plate
ax axial line
H through hole
Ha hole portion Ha1 decreased diameter portion
Hb narrow portion
Hc rear end side opening portion
Pa outer tubular body
Pb, Pbx inner tubular body
Pc central conductor
Pf tip portion
Pp protrusion portion
Pr, Pra probe (contact terminal)
SI1 inner first spring part
SI2 inner second spring part
SO1 outer first spring part
SO2 outer second spring part
SPb rear end surface
V vertical line

The invention claimed is:

1. A contact terminal comprising:
an outer tubular body being tubular and conductive; and
an inner tubular body being tubular and conductive, that is inserted into a cylinder of the outer tubular body, wherein
an outer first spring part that is elastic in an axial direction of the outer tubular body and whose winding direction is a first direction formed in a helical shape, is formed as part of the outer tubular body, and
an inner first spring part that is elastic in an axial direction of the inner tubular body and whose winding direction is a second direction that is opposite to the first direction formed in a helical shape, is formed as part of the inner tubular body.

2. The contact terminal according to claim 1, wherein the inner first spring part is positioned at a location aligned with the outer first spring part.

3. The contact terminal according to claim 1, wherein an outer second spring part whose winding direction is the second direction is further formed as part of the outer tubular body, and
an inner second spring part whose winding direction is the first direction is further formed as part of the inner tubular body.

4. The contact terminal according to claim 3, wherein the inner second spring part is positioned at a location aligned with the outer second spring part.

5. The contact terminal according to claim 1, wherein a number of turns of the outer first spring part and a number of turns of the inner first spring part are substantially equal.

6. The contact terminal according to claim 1, wherein a plurality of the outer first spring parts are formed at a plurality of places of the outer tubular body,
a plurality of the inner first spring parts are formed at a same number of places of the inner tubular body as the outer first spring parts respectively, and
a total number of turns of the outer first spring parts formed at the plurality of places and a total number of turns of the inner first spring parts formed at the plurality of places are substantially equal.

7. The contact terminal according to claim 6, wherein the plurality of outer first spring parts and the plurality of inner first spring parts are positioned at locations aligned with each other, and
a number of turns of one of the plurality of outer first spring parts and a number of turns of one of the plurality of inner first spring parts that are aligned with each other are substantially equal.

8. The contact terminal according to claim 3, wherein a number of turns of the outer second spring part and a number of turns of the inner second spring part are substantially equal.

9. The contact terminal according to claim 3, wherein a plurality of the outer second spring parts are formed at a plurality of places of the outer tubular body respectively,
a plurality of the inner second spring parts are formed at a same number of places of the inner tubular body as the outer second spring parts respectively, and
a total number of turns of the outer second spring parts formed at the plurality of places and a total number of turns of the inner second spring parts formed at the plurality of places are substantially equal.

10. The contact terminal according to claim 9, wherein the plurality of outer second spring parts and the plurality of inner second spring parts are positioned at locations aligned with each other, and
a number of turns of one of the plurality of outer second spring parts and a number of turns of one of the plurality of inner second spring parts that are aligned with each other are substantially equal.

11. The contact terminal according to claim 1, further comprising:
a central conductor being conductive and formed into a rod shape, that is inserted into a cylinder of the inner tubular body.

12. The contact terminal according to claim 11, wherein a vertical line with respect to an end surface of one end side of at least one of the outer tubular body and the inner tubular body is slanted relative to an axial line of the at least one of the outer tubular body and the inner tubular body.

13. An inspection jig comprising:
a plurality of the contact terminals according to claim 1; and
a support member that supports the plurality of contact terminals.

14. An inspection device comprising:
the inspection jig according to claim 13; and
an inspection processing portion configured to bring each of the contact terminals into contact with an inspection point of an inspection object and to inspect the inspection object according to an electric signal obtained from each of the contact terminals.

15. A contact terminal comprising:
an outer tubular body that is electrically conductive; and
an inner tubular body that is electrically conductive that is arranged within the outer tubular body;
wherein
the outer tubular body comprises an outer first spring part extending helically in an axial direction of the outer tubular body,
the inner tubular body comprises an inner first spring part extending helically in an axial direction of the inner tubular body, and
the outer first spring part has windings arranged in a first direction and the inner first spring part has windings arranged in a second direction opposite the first direction.

16. The contact terminal according to claim 15, wherein a number of turns of the outer first spring part and a number of turns of the inner first spring part are substantially equal.

17. The contact terminal according to claim 16, wherein the inner first spring part is aligned within the outer first spring part to offset magnetic fields generated in the inner first spring part and the outer first spring part, respectively.

18. The contact terminal according to claim 17, wherein the outer tubular body further comprises an outer second spring part spaced from the outer first spring part and extending helically in the axial direction of the outer tubular body,
the inner tubular body further comprises an inner second spring part spaced from the inner first spring part and extending helically in the axial direction of the inner tubular body, and
the outer second spring part has windings arranged in the second direction and the inner second spring part has windings arranged in the first direction.

19. The contact terminal according to claim 18, wherein a number of turns of the outer second spring part and a number of turns of the inner second spring part are substantially equal.

20. The contact terminal according to claim 19, wherein the inner second spring part is aligned within the outer second spring part to offset magnetic fields generated in the inner second spring part and the outer second spring part, respectively.

* * * * *